(12) United States Patent
Klapper et al.

(10) Patent No.: US 10,775,449 B2
(45) Date of Patent: Sep. 15, 2020

(54) MOBILE TRANSFORMER TEST DEVICE AND METHOD FOR TESTING A POWER TRANSFORMER

(71) Applicant: OMICRON ELECTRONICS GMBH, Klaus (AT)

(72) Inventors: Ulrich Klapper, Rankwell (AT); Matthias Kukuk, Lauterach (AT); Christoph Engelen, Rankweil (AT); Dirk Flax, Dornbirn (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 152 days.

(21) Appl. No.: 16/062,970

(22) PCT Filed: Dec. 14, 2016

(86) PCT No.: PCT/EP2016/080971
§ 371 (c)(1),
(2) Date: Jun. 15, 2018

(87) PCT Pub. No.: WO2017/102828
PCT Pub. Date: Jun. 22, 2017

(65) Prior Publication Data
US 2018/0372787 A1    Dec. 27, 2018

(30) Foreign Application Priority Data
Dec. 18, 2015 (AT) ............... A51082/2015

(51) Int. Cl.
*G01R 31/62* (2020.01)
*G01R 1/04* (2006.01)
(Continued)

(52) U.S. Cl.
CPC .......... *G01R 31/62* (2020.01); *G01R 1/0416* (2013.01); *G01R 33/14* (2013.01); *G01R 29/20* (2013.01)

(58) Field of Classification Search
CPC .... G01R 31/2827; G01R 31/013; H02H 3/20; H02H 3/05; H01C 7/12
(Continued)

(56) References Cited

U.S. PATENT DOCUMENTS 5,541,516 A * 7/1996 Rider ................. G01V 3/08
                                                          324/326
5,635,841 A * 6/1997 Taylor ................. F02P 17/00
                                                          324/380
(Continued)

FOREIGN PATENT DOCUMENTS

CN      104749537 A    7/2015
EP        1398644 A1    3/2004
(Continued)

*Primary Examiner* — Giovanni Astacio-Oquendo
(74) *Attorney, Agent, or Firm* — Seyfarth Shaw LLP; Brian Michaelis

(57) ABSTRACT

A mobile transformer test device (10) for testing a power transformer (40) has connectors (12) for the detachable connection of the transformer test device (10) to the power transformer (40). The transformer test device (10) has a source (5) for generating a test signal. The mobile transformer test device (10) has an evaluation circuit (6) for determining, based on the test signal and a test response of the power transformer (40), information regarding a B-H curve (50, 60) of the power transformer (40).

18 Claims, 5 Drawing Sheets

(51) Int. Cl.
*G01R 33/14* (2006.01)
*G01R 29/20* (2006.01)

(58) Field of Classification Search
USPC .......................................... 324/549, 500, 537
See application file for complete search history.

(56) References Cited

U.S. PATENT DOCUMENTS

| | | | | |
|---|---|---|---|---|
| 6,225,809 | B1* | 5/2001 | Watano | G01N 27/60 |
| | | | | 324/464 |
| 2008/0062022 | A1* | 3/2008 | Melanson | H03M 3/464 |
| | | | | 341/143 |
| 2008/0079444 | A1* | 4/2008 | Denison | G01D 5/24 |
| | | | | 324/679 |
| 2009/0204350 | A1* | 8/2009 | Govil | G01D 5/2417 |
| | | | | 702/65 |

FOREIGN PATENT DOCUMENTS

| | | |
|---|---|---|
| EP | 1653238 A1 | 5/2006 |
| EP | 2787357 A1 | 10/2014 |
| JP | S6040971 A | 3/1985 |

\* cited by examiner

MOBILE TRANSFORMER TEST DEVICE AND METHOD FOR TESTING A POWER TRANSFORMER

FIELD OF THE INVENTION

The invention relates to a transformer test device and to a method for testing transformers, in particular power transformers. The invention relates in particular to such devices and methods as are used to perform measurements that allow conclusions to be drawn as to magnetic properties of the transformer core.

BACKGROUND

Transformers are used as components of power supply grids. Transformers may be used for voltage conversion or current conversion.

Determining properties of a transformer by way of a transformer test, in which one or more characteristic variables of the transformer are ascertained through measurement, is necessary for example for ensuring operational safety, for actuation or for other reasons. Examples of such transformer tests include determining a static resistance, determining a dynamic resistance, determining a turns ratio and/or determining a leakage impedance or leakage inductance However, traditional transformer test techniques give only limited statements for characterizing magnetic properties of a main inductance of the transformer. Additional information that allows conclusions to be drawn as to the magnetic properties of the main inductance of the transformer would be desirable, not only for more accurate parameterization of an equivalent circuit of the transformer but also for more accurate detection of fault states. For example, damage or changes to the transformer core could be detected better if additional measurement variables, dependent on the magnetic properties of the transformer core, were to be available.

SUMMARY OF THE INVENTION

There is a need for devices and methods for improving a transformer test. There is a need in particular for devices and methods able to acquire measurement variables that allow conclusions to be drawn as to magnetic properties of a main inductance of the transformer, fault states connected thereto or other properties of the transformer.

According to exemplary embodiments, a transformer test device and a method for testing a transformer are specified, in which the transformer test device is configured to record a B-H curve of the transformer or to determine characteristic parameters of the B-H curve. To this end, the transformer test device may be configured to inject a DC current or an AC current, as the test signal, into at least one winding of the transformer. The current strength of the injected DC current or AC current may be set and monitored in an open or closed control loop as a measurement variable proportional to the magnetic field strength. A voltage that drops in at least one winding of the transformer may be detected as test response. A time integral of the voltage may be ascertained by an integrator circuit or by sampling and numerical integration of the voltage. The time integral of the voltage provides a measure for the magnetic flux density.

The transformer test device may be a mobile transformer test device. The transformer test device may in particular be configured to test power transformers.

The transformer test device may optionally carry out further processing steps. For example, characteristic parameters of the B-H curve may be ascertained automatically. Examples of such characteristic parameters that are able to be ascertained automatically by the transformer test device include a gradient of the B-H curve at its zero crossings, a gradient of the B-H curve at saturation and/or the position of a knee point of the B-H curve or a gradient of the B-H curve at the knee point.

The transformer test device may be configured to ascertain physical properties of the transformer from the B-H curve. By interpreting the physical properties, a differentiated diagnosis of the transformer is made possible.

In addition to acquiring the B-H curve, the transformer test device may also be configured to ascertain a windings ratio or—in particular for three-phase transformers several windings ratios, winding resistances, leakage inductances or leakage impedances or other characteristic variables of the transformer. The information regarding the B-H curve may be used in addition to these characteristic variables to parameterize an equivalent circuit of the transformer or to draw conclusions as to physical parameters of the transformer.

The transformer test device may be configured for example to ascertain damage to the core, the presence of a small air gap, statements regarding an overvoltage resistance and/or statements regarding an efficiency automatically from the characteristic variables, containing information regarding the B-H curve, that are ascertained by the transformer test device.

The transformer test device does not necessarily have to be configured to ascertain all constants of proportionality that define the scaling of the B- and H-axes of the B-H curve. For example, the transformer test device may be configured such that the current strength injected into a winding of the transformer is acquired as a measure for the magnetic field strength, without all constants of proportionality that influence the relationship between current strength and magnetic field strength having to be taken into account. As an alternative or in addition, the transformer test device may be configured such that a time integral of the voltage, which drops across a winding of the transformer in response to the DC or AC voltage injected as the test signal, is ascertained as a measure for the magnetic flux density, without all constants of proportionality that influence the relationship between time integral of the voltage and magnetic flux density having to be taken into account.

According to one exemplary embodiment, a transformer test device comprises connectors for the detachable connection of the transformer test device to a transformer. The transformer test device comprises a source for generating a test signal for the transformer. The transformer test device comprises an evaluation circuit configured, based on the test signal and a test response of the transformer, to determine information regarding a B-H curve of the transformer that defines a dependence of a magnetic flux density on a magnetic field strength in the transformer.

The evaluation circuit may be configured to determine data points of the B-H curve or at least one parameter of the B-H curve from the test signal and the test response.

The evaluation circuit may be configured to determine data points of an $I(t)-\int U(t')dt'$ curve or at least one parameter of the $I(t)-\int U(t')dt'$ curve from the test signal and the test response.

The evaluation circuit may be configured to ascertain a time integral of a voltage at at least one winding of the transformer.

The evaluation circuit may be configured to determine the magnetic flux density or a variable proportional to the magnetic flux density from the time integral of the voltage.

The evaluation circuit may be configured to acquire a current flowing in at least one winding of the transformer. To acquire the current, a correcting variable of a current source may be acquired in the transformer test device. The current source may have an internal ammeter or another current measurement apparatus used to regulate the current strength. The current strength acquired thereby may be used as a measure for the magnetic field strength in the ascertainment of the information regarding the B-H curve.

The evaluation circuit may be configured to determine the magnetic field strength from the current flowing in at least one winding of the transformer.

The source may be a current source that supplies the current flowing through the at least one winding of the transformer as the test signal. The current source may be controllable, so as to selectively supply a DC current or an AC current as the test signal. The current source may be controllable, so as to supply AC currents with different frequencies as the test signal.

The test signal may be an AC current.

The transformer test device may be configured to feed the test signal to a high-voltage side or to a low-voltage side of the power transformer.

The evaluation circuit may be configured to ascertain a gradient of the B-H curve at a zero crossing.

The evaluation circuit may, as an alternative or in addition, be configured to ascertain a gradient of the B-H curve at a saturation point.

The evaluation circuit may, as an alternative or in addition, be configured to ascertain a knee point of the B-H curve and/or a gradient of the B-H curve at the knee point.

The evaluation circuit may be configured to determine at least one physical property of the transformer from the ascertained information regarding the B-H curve. The at least one physical property may comprise an item of information regarding magnetic properties of the main inductance of the transformer. The transformer test device may be configured to use the item of information regarding magnetic properties of the main inductance in the parameterization of the transformer model.

The evaluation circuit may be configured to determine the at least one physical parameter also depending on a parameterization of a transformer model of the transformer. The parameterization may depend on further characteristic variables that are ascertained automatically by the transformer test device. For example, the parameterization may depend on a windings ratio, on leakage inductances or leakage impedances, on winding resistances or on other characteristic variables that are ascertained automatically by the transformer test device.

The transformer test device may comprise an input interface for inputting a switching group of the transformer.

The evaluation circuit may be configured to use the switching group of the transformer in the ascertainment or further evaluation of the information regarding the B-H curve. The evaluation circuit may be configured to use the switching group, able to be defined by way of the input interface, to define the variables to be parameterized of a transformer model.

The input interface may be configured such that the switching group of the transformer is able to be defined explicitly or implicitly. The input interface may be configured such that a type of the transformer is able to be input, the transformer test device automatically ascertaining the switching group from the type. To this end, the transformer test device may store information, stored in a non-volatile manner in a memory, regarding the different types of associated switching groups or retrieve information from a storage medium via an interface.

The input interface may be configured such that the switching group of the transformer is only able to be input selectively when it has been defined beforehand that the transformer is a three-phase transformer.

The transformer test device may be configured to determine the parameterization of the transformer model partly or completely automatically. The transformer test device may be configured, in the parameterization of the transformer model, depending on several measurements that contain the measurement for determining information regarding the B-H curve, to ascertain at least one windings ratio, winding resistances, leakage inductances or leakage impedances and a main inductance of the transformer.

The evaluation circuit may be configured to determine the parameterization of the transformer model depending on the item of information regarding the B-H curve.

To parameterize the transformer model, a leakage inductance of a high-voltage side of the transformer, a leakage inductance of a low-voltage side of the transformer, resistances of windings of the transformer, a saturation behavior of a main inductance of the transformer and/or losses in a core of the transformer may be determined.

The transformer test device may be configured, depending on the information regarding the B-H curve, to detect damage to a core of the transformer.

The transformer test device may be configured, depending on the information regarding the B-H curve, to detect the presence of an air gap.

The transformer test device may be configured, depending on the information regarding the B-H curve, to test an overvoltage resistance of the transformer.

The transformer test device may be configured, depending on the information regarding the B-H curve, to test an efficiency of the transformer.

A system according to one exemplary embodiment comprises a transformer, and a transformer test device according to one exemplary embodiment. The transformer test device is connected detachably to the transformer.

A method for testing a transformer using a transformer test device comprises generating a test signal for the transformer. The method comprises acquiring a test response of the transformer. The method comprises ascertaining information regarding a B-H curve of the transformer that defines a dependence of a magnetic flux density on a magnetic field strength in the transformer based on the test signal and the test response of the transformer.

Further features of the method and the effects respectively achieved thereby correspond to the designs and effects of the transformer test device that were described above.

The method may be performed with the transformer test device or the system according to one exemplary embodiment.

In the case of the devices, systems and methods according to exemplary embodiments, the transformer test device may be a mobile transformer test implement. The transformer test device may have a housing inside which the source for generating the test signal and the evaluation circuit are arranged.

In the case of the devices, systems and methods according to exemplary embodiments, the transformer may be a power transformer.

The power transformer may be a single-phase or a multiphase power transformer.

The transformer test device may be designed as a portable transformer test implement.

Transformer test devices, methods and systems according to exemplary embodiments allow extensive characterization of test specimens in transformer tests.

Transformer test devices, methods and systems according to exemplary embodiments allow, in particular, additional information regarding the magnetic properties of the main inductance of the transformer to be ascertained and, optionally, fault states to be detected automatically, which fault states relate to the core of the transformer or the space between the windings, wound around the transformer core, and the transformer core.

BRIEF DESCRIPTION OF THE FIGURES

The invention is explained in more detail below with reference to the drawings on the basis of preferred embodiments. In the drawings, identical reference signs denote identical elements.

DETAILED DESCRIPTION OF EXEMPLARY EMBODIMENTS

The present invention is explained in greater detail below on the basis of preferred embodiments with reference to the drawings. In the figures, the same reference signs denote the same or similar elements. The figures are schematic depictions of various embodiments of the invention. In the figures, elements that are shown are not necessarily shown true to scale. Moreover, the various elements shown in the figures are reproduced in such a way that their function and their purpose is comprehensible to those skilled in the art.

Connections and couplings, shown in the figures, between functional units and elements may also be implemented as an indirect connection or coupling. A connection or coupling may be implemented in a wired or wireless manner.

Devices and methods for performing a transformer test using a transformer test device are described in detail below. The transformer may be a power transformer.

The transformer may be a transformer for high-voltage or medium-voltage grids. The transformer may be a transformer installed in a power station or substation. The transformer test device may be a mobile implement allowing the transformer test to be performed on the installed transformer.

The transformer test device is configured to ascertain information regarding the B-H curve of the transformer. This information may be data points or characteristic parameters of the B-H curve. It is not absolutely necessary for the transformer test device to record the B-H curve itself. For example, it is possible to acquire data points that reflect the current flowing through a winding of the transformer as a measure for the magnetic field strength and the time integral of the acquired voltage in response to the current as a measure for the magnetic flux.

The transformer test device may be configured to inject a current, as the test signal, into a winding of the transformer. The transformer test device may be configured to inject the current, as the test signal, at a high-voltage side or a low-voltage side of the transformer. The transformer test device may be configured such that the injection of the test signal is able to be changed without rewiring between the transformer test device and the transformer, for example in order to perform measurements at various phases.

The transformer test device may be configured to inject the current as a DC current or as an AC current with time-dependently changeable frequency as the test signal.

The transformer test device may be constructed from one or more mobile, for example portable, implements.

Figure 1:
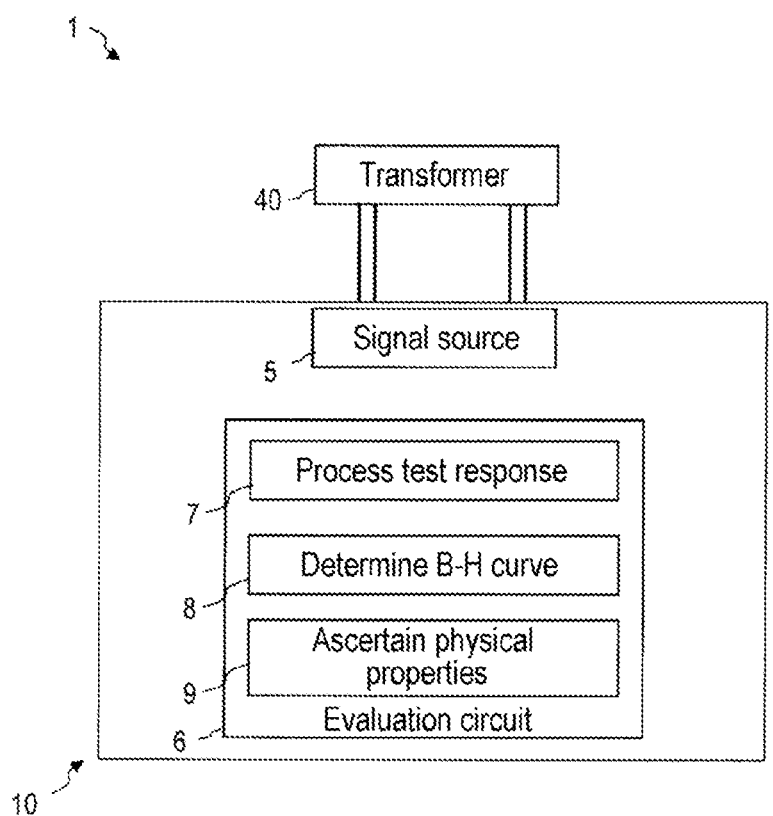
FIG. 1 shows a system with a transformer test device according to one exemplary embodiment.

FIG. 1 shows a system 1 with a transformer test device 10 according to one exemplary embodiment.

The system 1 comprises a test specimen, which may be a transformer 40, and the transformer test device 10. The transformer test device 10 may be embodied as a single implement with a housing 11. The transformer test device 10 may consist of an arrangement of several implements or apparatuses. The several implements or apparatuses may in this case be controlled by a central control system. The transformer test device 10 may be embodied as a mobile implement and in particular as a portable implement. If the transformer test device 10 consists of several implements, each of the implements may be embodied as a portable implement.

The transformer 40 may be a power transformer in an electric power supply apparatus. The transformer 40 may be installed in a fixed manner in a power station or substation, while a transformer test is performed by the transformer test device 10. The transformer 40 may be a voltage converter or a current converter. The transformer 40 may be a voltage converter or a current converter that operates according to an inductive operating principle.

The transformer 40 comprises at least one first winding and one second winding, and also a transformer core around which the first winding and the second winding may be wound. The transformer 40 may be a three-phase transformer.

The transformer test device 10 comprises a plurality of connectors for detachable connection to the transformer 40, a source 5 for a test signal that is applied to or injected into the transformer 40 as test specimen in the transformer test, and an evaluation circuit 6.

The source 5 may be a current source that is able to be controlled so as to generate a DC current and/or an AC current as the test signal. The source 5 may be able to be controlled so as to generate AC currents with several different frequencies as the test signal. The source 5 may be a voltage source that is able to be controlled so as to generate a DC voltage and/or an AC voltage as the test signal. The source 5 may be able to be controlled so as to generate AC voltages with several different frequencies as the test signal. The source 5 may be able to be operated in different operating modes, for example as a current source or as a voltage source and/or as a source of a temporally constant signal or an alternating signal.

The source 5 may comprise a current measurement apparatus. The source 5 may be configured to use an output signal from the current measurement apparatus in a control loop for current control. As an alternative or in addition, a current measurement apparatus may be connected in series with the source 5. The current strength, which is acquired by the current measurement apparatus integrated into the source 5 or by a current measurement apparatus separate therefrom, may be processed further by the evaluation circuit 6 in order to obtain a measure for the magnetic field strength in the transformer core.

The evaluation circuit 6 may be configured to acquire a test response of the transformer 10 to the test signal. The test response may be a voltage that drops at that winding into which the current is injected as the test signal. The test response may be a voltage that drops at another winding, different from that winding into which the current is injected as the test signal.

The evaluation circuit 6 may comprise a processing circuit 7 for processing the test response. The processing circuit 7 may comprise an integrator that integrates the voltage acquired as test response over time. The processing circuit 7 may comprise an analog-to-digital converter that converts the test response and supplies it for a numerical integration of the digital sampled values of the acquired voltage. The processing circuit 7 may be configured to integrate the sampled values of the acquired voltage numerically over time. The evaluation circuit 6 may be correspondingly configured to ascertain the time integral of the voltage as a measure for the magnetic flux density in the transformer core.

The evaluation circuit 6 may comprise a determination apparatus 8 for determining information regarding the B-H curve. The determination apparatus 8 may be configured to ascertain data points of a curve that indicates the magnetic flux density as a function of the magnetic field strength in the transformer core or depends thereon. The determination apparatus 8 does not necessarily have to take into account all constants of proportionality that influence scaling of the B-H curve. For example, to determine characteristic variables of the B-H curve, it is possible to acquire time integrals of the voltage that drop across a winding of the transformer in response to the test signal, in each case as a function of the current strength of the test signal. As an alternative or in addition, it is possible to ascertain characteristic parameters of the B-H curve, such as for example the position of zero crossings or the gradient of the B-H curve at the zero crossings, the gradient of the B-H curve at knee points or the gradient of the B-H curve at saturation.

The evaluation circuit 6 may comprise a diagnostic logic unit 9 for further processing of the information regarding the B-H curve. The diagnostic logic unit 9 may be configured also to ascertain physical parameters of the transformer at least depending on the B-H curve. The diagnostic logic unit 9 may be configured to ascertain at least one parameter of an equivalent circuit of the transformer, in particular at least the main inductance of the equivalent circuit, depending on the information regarding the B-H curve. The diagnostic logic unit 9 may be configured to further process the B-H curve and optionally other characteristic variables of the transformer that are ascertained automatically by the transformer test device 10 in order for example to detect damage to the transformer core or the formation of an air gap between winding and transformer core.

The evaluation circuit 6 may comprise one or more processors or microprocessors, one or more controllers, one or more application-specific special circuits (ASICs) or other integrated semiconductor circuits or combinations of the aforementioned or other semiconductor circuits, in order to ascertain information regarding the B-H curve or to further evaluate said information.

Figure 2:
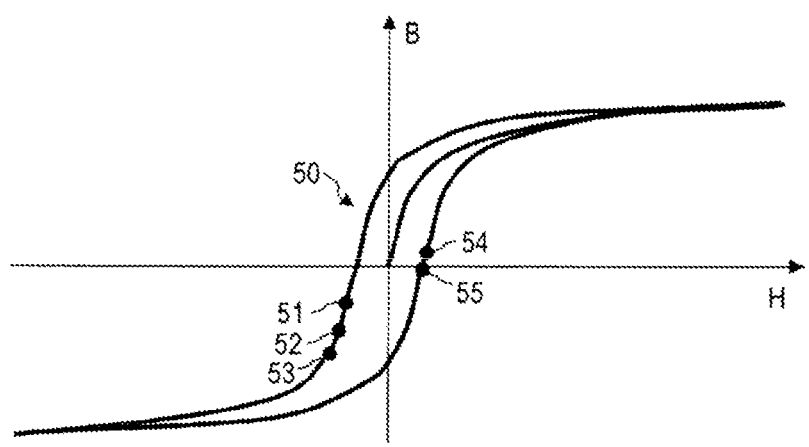
FIG. 2 shows a B-H curve able to be recorded automatically by a transformer test device according to one exemplary embodiment.

FIG. 2 shows an exemplary B-H curve 50 able to be recorded automatically by the transformer test device 10 according to one exemplary embodiment in the transformer test. The transformer test device 10 may automatically ascertain data points 51 to 53 of the B-H curve 50 in the transformer test. As an alternative or in addition, the transformer test device 10 may be configured such that it automatically determines certain characteristic parameters of the B-H curve 50. For example, the position of zero crossings 55 of the B-H curve 50 may be determined automatically. As an alternative or in addition, the gradient of the B-H curve 50 at the zero crossings 55 may be determined automatically. To this end, at least two data points 54, 55 close to a zero crossing may be acquired and processed further computationally in order to determine the gradient of the B-H curve 50 zero crossing 55. Similarly, the transformer test device 10, as an alternative or in addition, may ascertain the position of knee points or the gradient of the B-H curve at the knee points or at saturation.

Generally, the transformer test device 10 may be configured, in the transformer test, to automatically evaluate the relationship between magnetic field strength and magnetic flux density in the transformer core. To ascertain the information regarding the B-H curve 50, it is not necessary for the transformer test device 10 to ascertain data points of this curve itself. For example, it may be sufficient to sample data points of a curve that correlate the current strength through a winding of the transformer with the time integral of the voltage. The voltage may be acquired at that winding into which a DC current or an AC current with variable frequency is injected as the test signal. The voltage may be acquired at a winding other than that into which a DC current or an AC current with variable frequency is injected as the test signal.

The magnetic field strength may be represented as $$H(t)=c_1 I(t) \tag{1}$$

where $c_1$ may be a constant dependent on the geometry of the windings, the number of windings and the length of the winding.

The magnetic flux density can be represented as $$B(t)=c_2 \int_0^t U(t')dt', \tag{2}$$

where $c_2$ is a constant and the time integral is ascertained by integrating the voltage at a winding of the transformer starting from the time at which the test signal is applied.

Essential properties regarding the transformer and the magnetic properties of its main inductance may already be obtained from a curve that correlates the current strength and the time integral of the voltage. It is correspondingly possible, but not absolutely necessary, for the transformer test device also to ascertain the ratio of the two constants of proportionality $c_1$ and $c_2$ in equations (1) and (2).

Figure 3:
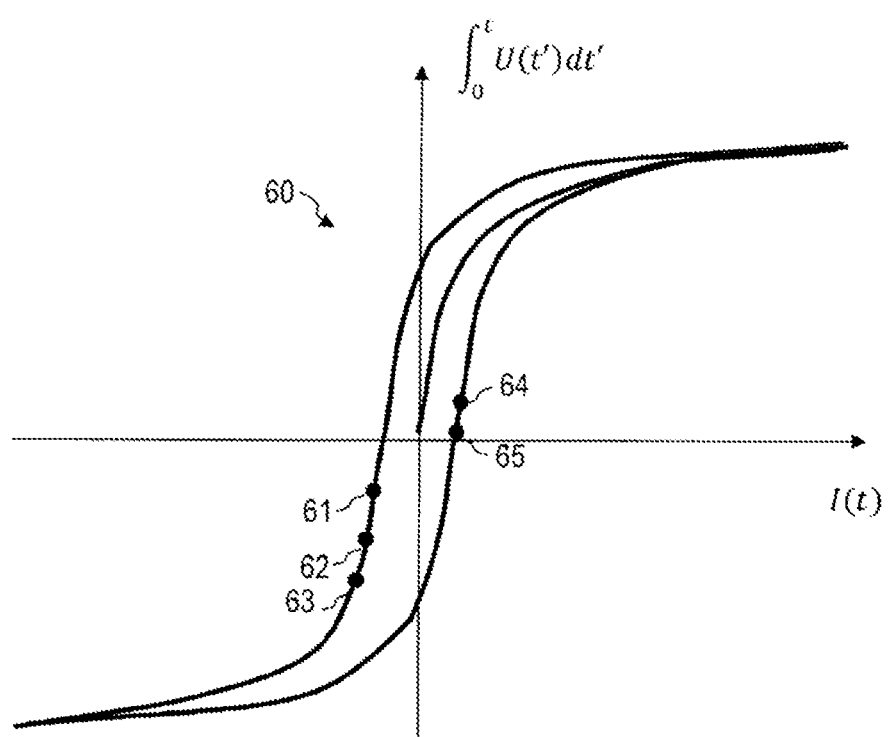
FIG. 3 shows an $I(t)$–$\int U(t')dt'$ curve able to be recorded automatically by a transformer test device according to one exemplary embodiment for the purpose of ascertaining information regarding the B-H curve.

FIG. 3 shows a curve 60 that depicts the relationship between the time integral of the voltage acquired by the transformer test device 10 and the current injected as the test signal. The $I(t)-\int U(t')dt'$ curve 60 may correspond to the B-H curve shown in FIG. 2 apart from scaling factors along the two axes. Important information may already be derived from the shape of the $I(t)-\int U(t')dt'$ curve 60.

The transformer test device 10 may correspondingly be configured to determine data points 61-63 of the $I(t)-\int U(t')dt'$ curve 60. The transformer test device 10 may, as an alternative or in addition, be configured to determine a zero crossing 65 of the I(t)–∫U(t')dt' curve 60. The transformer test device 10 may, as an alternative or in addition, be configured to determine, from data points 64, 65 close to the zero crossing 65, the gradient of the I(t)–∫U(t')dt' curve 60 at the zero crossing. Similarly, the transformer test device may ascertain the position of knee points or the gradient of the curve 60 at the points or at saturation.

Figure 4:
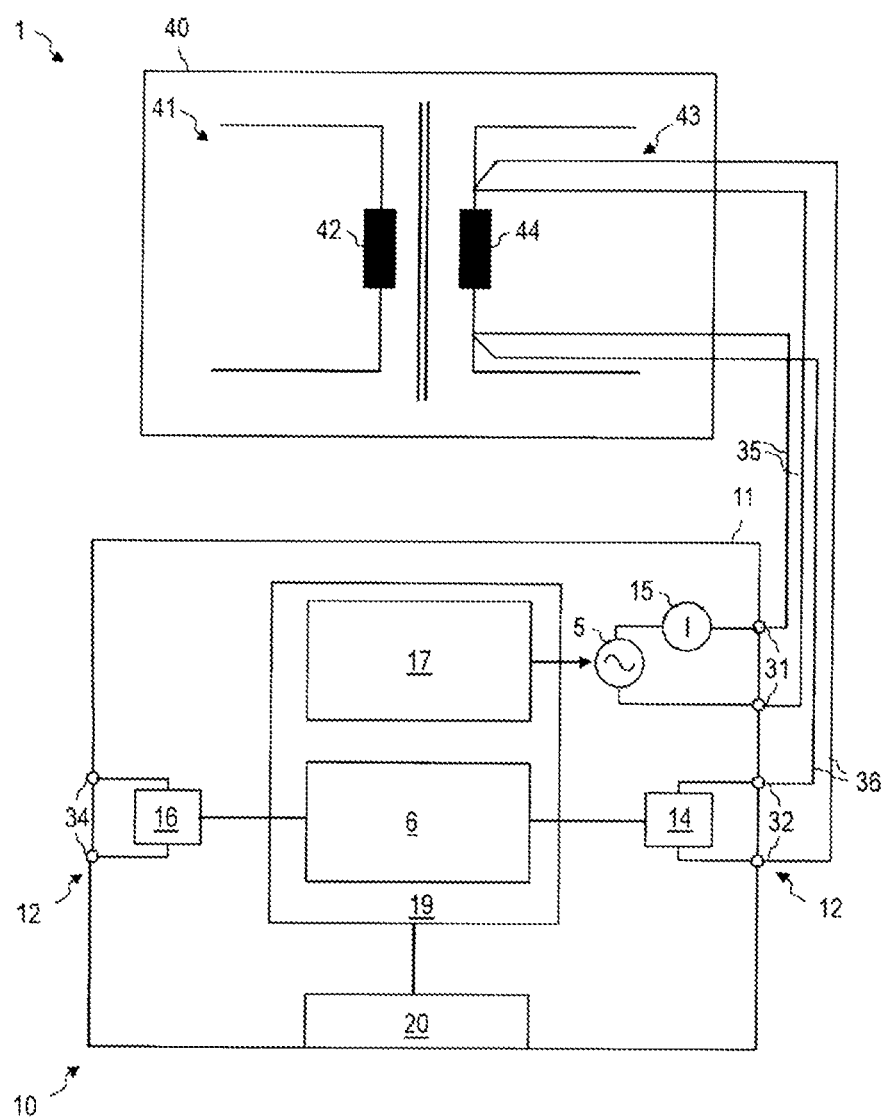
FIG. 4 shows a system with a transformer test device according to one exemplary embodiment.

FIG. 4 shows a system 1 with a transformer test device 10 according to one exemplary embodiment. The transformer test device 10 is configured for detachable coupling to a transformer 40 in order to ascertain information regarding a B-H curve for the transformer test device.

The transformer 40 has a high-voltage side 41 with a first winding 42 and a low-voltage side 43 with a second winding 44. The transformer 40 may also be designed as a three-phase transformer, the secondary windings of the different phases being able to be interconnected in different ways according to the switching group of the transformer 40.

The transformer test device 10 is configured to inject a test signal, which may be a DC current or an AC current with variable frequency, at the first winding 42 or the second winding 44. The transformer test device 10 may be configured such that it is able to be connected both to the high-voltage side 41 and to the low-voltage side 43 so as to inject the test signal selectively at the high-voltage side 41 or the low-voltage side 43 without rewiring. The test signal may be injected selectively at the high-voltage side 41 or at the low-voltage side 43, independently of whether the transformer test device is connected to both sides or only to that side at which the test signal is injected.

The transformer test device 10 comprises a source 5, which may be designed as a current source. The source 5 may be designed as described with reference to FIG. 1. The source 5 may contain a current measurement apparatus or may be connected in series with a current measurement apparatus 15. A current acquired by the current measurement apparatus 15 may be used by the evaluation circuit 6 to ascertain information regarding the B-H curve of the transformer 40.

The transformer test device 10 comprises a plurality of connectors 12 for coupling to at least one side of the transformer 40. The transformer test device 10 may comprise a plurality of connectors 12 that include connectors 34 for connecting to the high-voltage side 41 and further connectors 31, 32 for connecting to the low-voltage side 43 of the transformer 40.

The transformer test device 10 may be configured to connect the source 5 selectively to connectors for connecting to the high-voltage side 41 or to connectors for connecting to the low-voltage side 43 of the transformer 40, without rewiring of the connections 35, between the transformer test device 10 and the transformer 40 having to take place. The transformer test device 10 may comprise controllable switching means that allow the test signal generated by the source 5 to be output selectively at the high-voltage side 41 or the low-voltage side 43 of the transformer 40.

The transformer test device 10 may comprise further apparatuses, for example one or more measurement apparatuses 14, 16 for acquiring a test response in response to the test signal. The measurement apparatuses 14, 16 may be voltage measurement apparatuses, for example voltmeters.

The transformer test device 10 may comprise a control apparatus 17 for automatically electrically controlling the source 5. The transformer test device 10 comprises an evaluation circuit 6 for evaluating a test response of the transformer 40, which response is acquired by the measurement apparatuses 14, 16. The first measurement apparatus 14 and the second measurement apparatus 16 may in each case be configured for a voltage measurement. The evaluation circuit 6 may be configured to determine a time integral of the voltage, acquired by the first measurement apparatus 14 or the second measurement apparatus 16, which drops across a winding of the transformer 40 in response to the test signal. To this end, the evaluation circuit 6 may comprise an integrator or an analog-to-digital converter in combination with a digital integration apparatus. The evaluation circuit 6 may be configured to ascertain a current strength of the current output by the source 5 and a time integral of the voltages acquired by at least one of the measurement apparatuses 14, 16 in order to determine information regarding the B-H curve of the transformer 40.

The functions of the control apparatus 17 and/or of the evaluation circuit 6 may be performed by a processor 19 or another integrated semiconductor circuit 19.

The source 5 may generate a time-variable test signal. A frequency of the test signal may be changeable between several values. The first measurement apparatus 14 and the second measurement apparatus 16 may be configured for the time-resolved acquisition of a test response. Measured values acquired by the first measurement apparatus 14 and the second measurement apparatus 16 may be subjected to analog-to-digital conversion and further evaluated computationally, for example in order to determine characteristic variables of the transformer for each of several frequencies.

The transformer 40 may also comprise more than two windings 41, 42. The transformer test device 10 may comprise connectors for connecting to a third winding of the transformer 40 and possible other windings of the transformer 40.

The transformer 40 may be a multiphase power transformer. The transformer test device 10 may have connectors for simultaneously connecting to several phases of the multiphase power transformer.

The transformer test device 10 may be configured such that different measurements may take place, without the connections 35, 36 between the transformer test device 10 and the transformer 40 having to be detached and/or connected differently. The various measurements may be performed without the test specimen having to be rewired. The measurements may be performed by the transformer test device 10 in a completely or partly automated manner, i.e. without interaction of the user between the measurements. The measurements may comprise ascertaining information regarding the B-H curve and other characteristic variables of the transformer 40. For example, these other measurements may be used to ascertain the windings ratio, leakage impedances or leakage inductances, winding resistances or other characteristic variables of the transformer 40. The information obtained from these measurements may be used to automatically determine the various parameters of an equivalent circuit of the transformer 40. The information regarding the B-H curve may in particular be used to determine the value of the main inductance in the equivalent circuit of the transformer.

As was described with reference to FIG. 1 to FIG. 3, the evaluation circuit 6 may furthermore be configured, depending on the B-H curve and optionally other measurements at the transformer 40, to detect whether the transformer core is damaged, an air gap has formed between a winding and the transformer core, whether the overvoltage resistance and the efficiency of the transformer 40 are within a permissible range, or whether other fault states are present.

The further evaluation of the B-H curve, for example for parameterizing the transformer model or for detecting fault states, may be carried out by the evaluation circuit 6 depending on an input received via an input interface 20. It is able to be input via the input interface 20, for example, whether the transformer 40 is a three-phase transformer. If the transformer 40 is a three-phase transformer, the input interface 20 may selectively allow the definition of a switching group to which the transformer 40 belongs. The further evaluation of the B-H curve may be performed by the evaluation circuit 6 depending on whether the transformer 40 is a three-phase transformer and to which switching group the transformer 40 belongs, where applicable.

Different phases of the transformer 40 may be tested by the transformer test device 10 simultaneously or sequentially in time.

Figure 5:
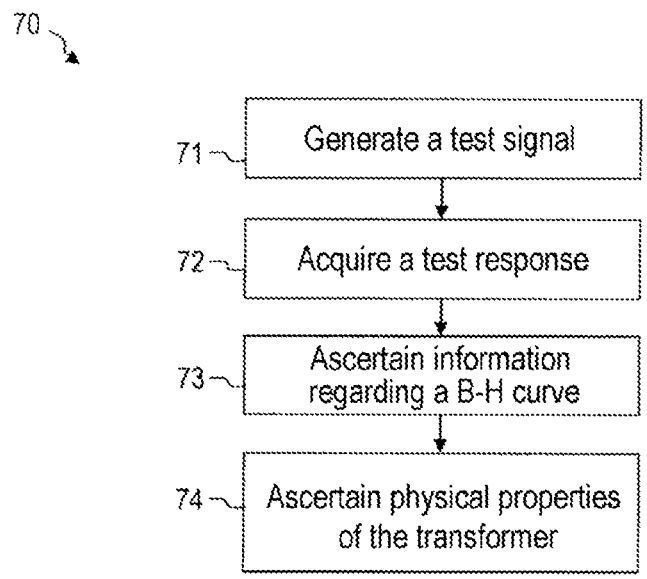
FIG. 5 is a flow chart of a method according to one exemplary embodiment.

FIG. 5 is a flow chart of a method 70 according to one exemplary embodiment. The method 70 may be performed automatically by the transformer test device 10 according to one exemplary embodiment.

In step 71, the transformer test device generates a test signal. The test signal may be a DC current. The test signal may be an AC current. If the test signal is an AC current, a frequency of the AC current may be changed in a time-dependent manner while the test response is being acquired.

The test signal may be injected into a coil at a high-voltage side or a coil at a low-voltage side of the transformer 40.

In step 72, a test response of the transformer 40 is acquired. The test response may be a voltage that drops at a winding of the transformer 40 when the test signal is applied.

In step 73, information regarding a B-H curve of the transformer 40 is ascertained. The information may comprise data points that indicate the time integral of the voltage acquired in step 72, dependent in each case on the applied current. The information may comprise data points of the B-H curve or characteristic parameters of the B-H curve, such as for example the zero crossings or knee points or the gradient of the B-H curve at the zero crossings, knee points or at saturation.

The evaluation in step 73 may comprise integrating the voltage acquired in step 72. An evaluation circuit of the transformer test device may comprise an integrator circuit that integrates the voltage. As an alternative or in addition, the integration may take place numerically, for example following an analog-to-digital conversion.

In step 74, physical properties of the transformer may optionally be ascertained depending on the information regarding the B-H curve. The ascertained physical properties may depend on the magnetic properties of the transformer core. For example, damage to the transformer core may be detected automatically. As an alternative or in addition, an air gap between one of the windings and the transformer core may be detected automatically. As an alternative or in addition, impairments of the overvoltage resistance or of the efficiency of the transformer 40 may be detected automatically.

The ascertainment of the physical properties in step 74 may include parameterizing a transformer model. In this case, the information regarding the B-H curve may be combined with other measurements that are performed by the transformer test device 10 sequentially in time with respect to the ascertainment of the B-H curve at the transformer 40. Such measurements may for example be used to ascertain a turns ratio, leakage impedances or leakage inductances or winding resistances.

Figure 6:
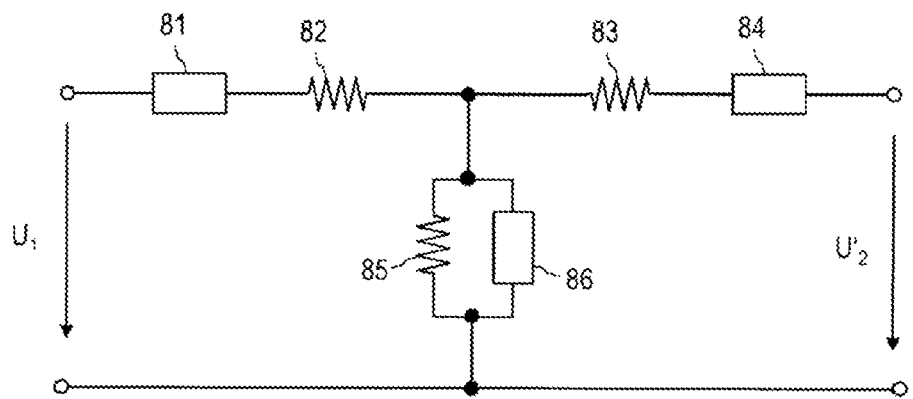
FIG. 6 illustrates an equivalent circuit able to be parameterized automatically by a transformer test device according to one exemplary embodiment.

FIG. 6 shows an equivalent circuit of the transformer 40. The winding resistance $R_1$ of the high-voltage side 41 may be represented by a resistance 81. The transformed winding resistance $R_2'$ of the low-voltage side 43 may be represented by a resistance 84. The leakage inductance $L_{o1}$ of the high-voltage side 41 may be represented by an inductance 82. The transformed leakage inductance $L_{o2}'$ of the low-voltage side 43 may be represented by an inductance 83. The resistances 81, 84 and inductances 82, define the overall series inductance of the transformer. The inductances 82, 83 define the untransformed, i.e. unprimed, overall leakage inductance, which is able to be converted, by scaling with the square of the turns ratio in a manner known per se, into a primed characteristic variable of the transformer.

A main inductance carrying the magnetizing current may be taken into account by an inductance 85. Linear modeling of losses in the transformer core may take place by means of a resistance 86.

The transformer test device 10 according to one exemplary embodiment may be configured, by ascertaining information regarding the B-H curve of the transformer, to determine at least the inductance 85 of the main inductance carrying the magnetizing current. Parameterization of the transformer model, in which the resistances and inductances shown in FIG. 6 are ascertained, may be performed automatically by the transformer test device 10.

Figure 7:
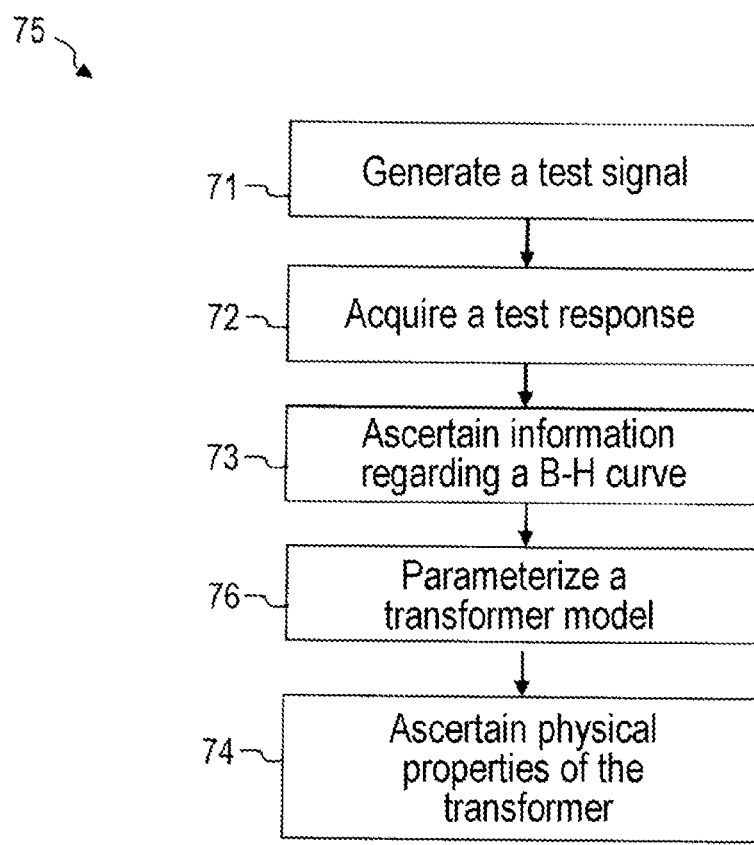
FIG. 7 is a flow chart of a method according to one exemplary embodiment.

FIG. 7 is a flow chart of a method 75 according to one exemplary embodiment. The method 75 may be performed automatically by the transformer test device 10 according to one exemplary embodiment.

In the method 75, steps 71 to 74 may be performed as described with reference to FIG. 5.

The method 75 may include parameterizing a transformer model in step 76. In the parameterization of the transformer model, several measurements that were performed on a transformer 40 may be evaluated in order to determine the various parameters of the transformer model. These parameters may include the main inductance of the transformer, which main inductance may at least also be determined in a manner dependent on the ascertained B-H curve.

Although exemplary embodiments have been described in detail with reference to the figures, alternative or additional features may be used in other exemplary embodiments. Although for example the use of a transformer test device in combination with a transformer with two windings has been described, the devices and methods according to exemplary embodiments may also be used for transformers with three windings or more than three windings.

Although, in exemplary embodiments, the transformer test device may comprise a signal source for generating the test signal, the transformer test device may also comprise two or more sources in order to inject currents into different windings of the transformer.

Although, in exemplary embodiments, a test procedure that includes determining several characteristic variables of the transformer may be performed automatically, the transformer test device and the method, according to exemplary embodiments, may also be used when only one characteristic variable of the transformer is measured, before a new user input is necessary.

Although the transformer is able to be installed in a power station or substation of a power supply grid, the transformer test device and the method, according to exemplary embodiments, may also be used in the case of smaller transformers.

Transformer test devices, methods and systems, according to exemplary embodiments, allow extensive characterization of a transformer in the transformer test. In particular, additional information regarding the magnetic behavior of the main inductance may be obtained.

The invention claimed is:

1. A mobile transformer test device, comprising
connectors for the detachable connection of the mobile transformer test device to a power transformer,
a source for generating a test signal for the power transformer, and
an evaluation circuit configured, based on the test signal and a test response of the power transformer, to determine information regarding a B-H curve of the power transformer that defines a dependence of a magnetic flux density on a magnetic field strength in the power transformer.

2. The mobile transformer test device as claimed in claim 1,
wherein the evaluation circuit is configured to determine at least one of the following parameters of the B-H curve:
a gradient of the B-H curve at a zero crossing,
a gradient of the B-H curve at a saturation point,
a knee point of the B-H curve.

3. The mobile transformer test device as claimed in claim 1,
wherein the evaluation circuit is configured to determine at least one physical property of the power transformer from the ascertained information regarding the B-H curve.

4. The mobile transformer test device as claimed in claim 3,
wherein the evaluation circuit is configured to determine the at least one physical property depending on a parameterization of a transformer model of the power transformer.

5. The mobile transformer test device as claimed in claim 4, comprising an input interface for inputting a switching group of the power transformer, on which switching group the transformer model depends.

6. The mobile transformer test device as claimed in claim 4,
wherein the transformer test device is configured to determine the parameterization of the transformer model partly or completely automatically.

7. The mobile transformer test device as claimed in claim 4,
wherein the evaluation circuit is configured to determine the parameterization of the transformer model depending on the item of information regarding the B-H curve.

8. The mobile transformer test device as claimed in claim 4,
wherein, to parameterize the transformer model, a leakage inductance of a high-voltage side of the power transformer, a leakage inductance of a low-voltage side of the power transformer, resistances of windings of the power transformer, a saturation behavior of a main inductance of the power transformer and/or losses in a core of the power transformer are determined.

9. The mobile transformer test device as claimed in claim 1,
wherein the transformer test device is configured to acquire at least one of the following items of information depending on the B-H curve:
damage to a core of the power transformer,
the presence of an air gap,
an overvoltage resistance of the power transformer (40),
an efficiency of the power transformer.

10. The mobile transformer test device as claimed in claim 1,
wherein the evaluation circuit is configured to determine data points of the B-H curve or at least one parameter of the B-H curve from the test signal and the test response.

11. The mobile transformer test device as claimed in claim 1,
wherein the evaluation circuit is configured to ascertain a time integral of a voltage at at least one winding of the power transformer.

12. The mobile transformer test device as claimed in claim 11,
wherein the evaluation circuit is configured to determine the magnetic flux density or a variable proportional to the magnetic flux density from the time integral of the voltage.

13. The mobile transformer test device as claimed in claim 1,
wherein the evaluation circuit is configured to acquire a current flowing in at least one winding of the power transformer.

14. The mobile transformer test device as claimed in claim 13,
wherein the evaluation circuit is configured to determine the magnetic field strength from the current flowing in at least one winding of the power transformer.

15. The mobile transformer test device as claimed in claim 13,
wherein the source is a current source that supplies the current flowing through the at least one winding of the power transformer as the test signal.

16. The mobile transformer test device as claimed in claim 1,
wherein the test signal is an AC current.

17. A system, comprising
a power transformer, and
a mobile transformer test device wherein the mobile transformer test device is connected detachably to the power transformer, and the mobile transformer test device, comprises connectors for the detachable connection of the mobile transformer test device to the power transformer, a source for generating a test signal for the power transformer, and
an evaluation circuit configured, based on the test signal and a test response of the power transformer, to determine information regarding a B-H curve of the power transformer that defines a dependence of a magnetic flux density on a magnetic field strength in the power transformer.

18. A method for testing a power transformer using a mobile transformer test device, comprising:
generating with the mobile transformer test device a test signal for the power transformer,
acquiring with the mobile transformer test device a test response of the power transformer, and
ascertaining with the mobile transformer test device information regarding a B-H curve of the power transformer that defines a dependence of a magnetic flux density on a magnetic field strength in the power transformer based on the test signal and the test response of the power transformer.

* * * * *